United States Patent
Liu et al.

(10) Patent No.: US 10,412,823 B2
(45) Date of Patent: Sep. 10, 2019

(54) CIRCUIT COMPONENTS AND METHODS FOR MANUFACTURING THE SAME AND BONDING DEVICES

(71) Applicants: BOE TECHNOLOGY GROUP CO., LTD., Beijing (CN); Chengdu BOE Optoelectronics Technology Co., Ltd., Chengdu, Sichuan Province (CN)

(72) Inventors: Tingliang Liu, Beijing (CN); Shuo Jin, Beijing (CN); Yuanjie Xu, Beijing (CN)

(73) Assignees: BOE TECHNOLOGY GROUP CO., LTD., Beijing (CN); CHENGDU BOE OPTOELECTRONICS TECHNOLOGY CO., LTD., Chengdu, Sichuan Province (CN)

( * ) Notice: Subject to any disclaimer, the term of this patent is extended or adjusted under 35 U.S.C. 154(b) by 0 days.

(21) Appl. No.: 15/713,362

(22) Filed: Sep. 22, 2017

(65) Prior Publication Data
US 2018/0242445 A1    Aug. 23, 2018

(30) Foreign Application Priority Data
Feb. 17, 2017   (CN) .......................... 2017 1 0087428

(51) Int. Cl.
*H05K 1/02* (2006.01)
*H05K 1/16* (2006.01)
(Continued)

(52) U.S. Cl.
CPC ........... *H05K 1/0269* (2013.01); *H05K 1/165* (2013.01); *H05K 1/181* (2013.01); *H05K 1/189* (2013.01);
(Continued)

(58) Field of Classification Search
CPC ....... B05D 1/02; B23K 20/10; G02F 1/13452; H01L 23/83
(Continued)

(56) References Cited

U.S. PATENT DOCUMENTS 6,056,453 A * 5/2000 Hufman .................. B41J 2/395
                                                        342/142
6,337,522 B1 * 1/2002 Kang ........................ H01L 24/83
                                                        257/673
(Continued)

FOREIGN PATENT DOCUMENTS

CN         1964011 A     5/2007
CN       105392272 A     3/2016
(Continued)

OTHER PUBLICATIONS

First Chinese Office Action, for Chinese Patent Application No. 201710087428.8, dated Jul. 3, 2018, 14 pages.

*Primary Examiner* — Tuan T Dinh
(74) *Attorney, Agent, or Firm* — Kinney & Lange, P.A.

(57) ABSTRACT

The present disclosure discloses a circuit component and a method for manufacturing the same and a bonding device. The circuit component comprises a first circuit board and a second circuit board, wherein at least one of the first circuit board and the second circuit board comprises a bonding detection layer configured to be capable of detecting a bonding parameter between the first circuit board and the second circuit board; and emitting a detection signal when the bonding parameter reaches a preset value.

12 Claims, 2 Drawing Sheets

(51) Int. Cl.
*H05K 1/18* (2006.01)
*H05K 3/30* (2006.01)
*H05K 3/32* (2006.01)
*H05K 1/14* (2006.01)
*H05K 3/36* (2006.01)

(52) U.S. Cl.
CPC ............ *H05K 3/305* (2013.01); *H05K 3/321* (2013.01); *H05K 1/144* (2013.01); *H05K 1/147* (2013.01); *H05K 3/361* (2013.01); *H05K 2201/041* (2013.01); *H05K 2201/049* (2013.01); *H05K 2201/10128* (2013.01); *H05K 2203/0278* (2013.01); *H05K 2203/161* (2013.01); *H05K 2203/163* (2013.01)

(58) Field of Classification Search
USPC ................. 361/749, 761–764, 767–782; 174/250–264; 156/247, 307.1; 349/149–150
See application file for complete search history.

(56) References Cited

U.S. PATENT DOCUMENTS

| | | | |
|---|---|---|---|
| 8,287,670 B2* | 10/2012 | Kim | B23K 20/10 156/307.1 |
| 9,388,519 B1* | 7/2016 | Gallant | A44B 18/0011 |
| 2005/0162603 A1* | 7/2005 | Cheng | G02F 1/13452 349/149 |
| 2006/0078472 A1* | 4/2006 | Momiyama | B01F 9/0016 422/400 |
| 2007/0107827 A1 | 5/2007 | Takahashi et al. | |
| 2008/0143906 A1* | 6/2008 | Allemand | B82Y 10/00 349/43 |
| 2013/0270329 A1* | 10/2013 | Schulte | H01L 24/11 228/180.22 |
| 2013/0305946 A1* | 11/2013 | Iftime | C09D 11/50 101/483 |
| 2015/0061723 A1* | 3/2015 | Zhang | G09G 3/006 324/762.01 |
| 2016/0148965 A1* | 5/2016 | Clayton | H01L 27/14634 257/293 |
| 2016/0167358 A1* | 6/2016 | Tang | B05D 1/02 156/247 |
| 2017/0196080 A1 | 7/2017 | Meng et al. | |
| 2018/0007793 A1 | 1/2018 | Zhang et al. | |

FOREIGN PATENT DOCUMENTS

| | | |
|---|---|---|
| CN | 105632382 A | 6/2016 |
| JP | 2010141265 A | 6/2010 |

* cited by examiner

CIRCUIT COMPONENTS AND METHODS FOR MANUFACTURING THE SAME AND BONDING DEVICES

CROSS-REFERENCE TO RELATED APPLICATION(S)

The present application claims priority to the Chinese Patent Application No. 201710087428.8, filed on Feb. 17, 2017, entitled "CIRCUIT COMPONENTS AND METHODS FOR MANUFACTURING THE SAME AND BONDING DEVICES," which is incorporated herein by reference in its entirety.

TECHNICAL FIELD

The present disclosure relates to the field of display technology, and more particularly, to a circuit component, a bonding device for bonding the circuit component and a method for manufacturing the circuit component.

BACKGROUND

In general, in the field of display, Integrated Circuits (ICs for short), Flexible Printed Circuits (FPCs for short) and Chip On Flexes (COFs for short) are widely used to connect a display apparatus and a driving circuit. A FPC is a highly reliable and flexible printed circuit board which uses a polyimide or polyester film as a substrate, and has characteristics such as high wiring density, light weight, thin thickness, and good bending. A COF is a granular flexible film packaging technology of fixing an IC onto a FPC, and is a technology of combing a chip with a flexible substrate circuit using an additional flexible circuit board as an encapsulation chip carrier.

When the IC, the FPC and the COF are connected to the display apparatus as described above, the connection is realized through bonding by using a bonding process. The bonding process specifically comprises the following steps. In a first step, an Anisotropic Conductive adhesive (ACF for short) is coated on a display substrate; in a second step, the FPC/COF is aligned to be placed at a specific location; and in a third step, the FPC/COF is pressed fit using a bonding device to be bonded onto the display substrate.

However, in the above bonding process, an intensity of a bonding pressure for the IC, the FPC, and the COF is 1 MPa to 150 MPa per bump (wherein the bump corresponds to an electrode on the display substrate). Due to various factors such as unstable process etc., poor bonding often occurs, which causes the IC, the FPC and the COF etc. to be separated from the display pate later or a degree of adhesion between the IC, the FPC and the COF and the display substrate is not sufficient, thereby resulting in unstable signal transmission.

Therefore, there is a need to detect a display apparatus after the completion of the bonding. In a conventional detection method, after the bonding is completed, a part or even all of the products are randomly selected to be amplified and detected under a microscope, and parameters such as a number, diameters etc. of gold balls at specific observation locations are determined experimentally to determine the yield of the bonding process. The process is complex, and even a detection missing phenomenon easily occurs, resulting in poor characteristics of the products and affecting the performance of the products.

SUMMARY

Therefore, how to better improve the bonding yield becomes a technical problem to be solved in the prior art.

The embodiments of the present disclosure aim to at least partially address or mitigate one of the technical problems that exist in the related art, and propose a circuit component, a bonding device for bonding the circuit component, and a method for manufacturing the circuit component.

In order to achieve the above purposes, in a first aspect of the present disclosure, there is provided a circuit component, comprising: a first circuit board; and a second circuit board, wherein at least one of the first circuit board and the second circuit board comprises a bonding detection layer configured to be capable of: detecting a bonding parameter between the first circuit board and the second circuit board; and emitting a detection signal when the bonding parameter reaches a preset value.

In some embodiments, the circuit component further comprises: a conductive adhesive layer provided between the first circuit board and the second circuit board, and configured to electrically connect corresponding conductive loops on the first circuit board and the second circuit board.

In some embodiments, the first circuit board comprises a first base substrate and the bonding detection layer is provided on the first base substrate.

In some embodiments, the bonding detection layer comprises a pressure detection layer, and the bonding parameter is a bonding pressure value; and/or the bonding detection layer comprises a deformation quantity detection layer, and the bonding parameter is a deformation quantity of the bonding detection layer.

In some embodiments, when the bonding detection layer comprises a pressure detection layer, the pressure detection layer comprises a mechanochromism material layer, and when a bonding pressure value received by the mechanochromism material layer does not reach a preset pressure value, a first color is displayed; and when the bonding pressure value received by the mechanochromism material layer reaches the preset pressure value, a second color is displayed, wherein the detection signal comprises a color signal of the second color.

In some embodiments, when the bonding detection layer comprises a pressure detection layer, the pressure detection layer comprises a fluorescent film, and when a bonding pressure value received by the fluorescent film does not reach a preset pressure value, the fluorescent film emits fluorescence at a first intensity, and when the bonding pressure value received by the fluorescent film reaches the preset pressure value, the fluorescent film emits fluorescence at a second intensity, wherein the detection signal comprises a fluorescence signal at the second intensity emitted by the fluorescent film.

In some embodiments, the first circuit board comprises any of an integrated circuit, a flexible printed circuit, and a chip on flex.

In some embodiments, the second circuit board comprises a display substrate.

In some embodiments, the first circuit board comprises a plurality of first conductive loops, and the second circuit board comprises a plurality of second conductive loops, each of the first conductive loops corresponding to one of the second conductive loops; and at least one of the first circuit board and the second circuit board comprises a plurality of bonding detection layers, each of the bonding detection layers being provided correspondingly to a conductive loop on a corresponding circuit board.

In a second aspect of the present disclosure, there is provided a bonding device for bonding circuit components including the circuit component according to any of the embodiments described above, comprising: a bonding parameter detector and a controller, wherein the bonding parameter detector is configured to detect the bonding parameter; and the controller is configured to receive the detection signal and control the bonding device to stop applying the bonding when the detection signal has been received.

In some embodiments, the bonding parameter detector comprises a fluorescence intensity detector.

In a third aspect of the present disclosure, there is provided a method for manufacturing a circuit component, comprising:

providing a first circuit board and a second circuit board;

applying a bonding pressure; and stopping applying the bonding pressure when a detection signal is emitted by a bonding detection layer, to obtain the circuit component, wherein the bonding detection layer is provided on the first circuit board and/or the second circuit board, and when the bonding parameter reaches a preset value, the bonding detection layer is able to emit the detection signal.

In some embodiments, before applying the bonding pressure, the method further comprises: coating at least one of the first circuit board and the second circuit board with a conductive adhesive.

BRIEF DESCRIPTION OF THE DRAWINGS

The accompanying drawings are used to provide a further understanding of the embodiments of the present disclosure, constitute a part of the specification, and explain the present disclosure together with the following detailed description, but are not to be construed as limiting the present disclosure. In the accompanying drawings.

DETAILED DESCRIPTION

Hereinafter, some specific embodiments of the present disclosure will be described in detail with reference to the accompanying drawings. It is to be understood that the specific embodiments described herein are for the purpose of illustration and explanation only and are not intended to limit the present disclosure.

Figure 1A:
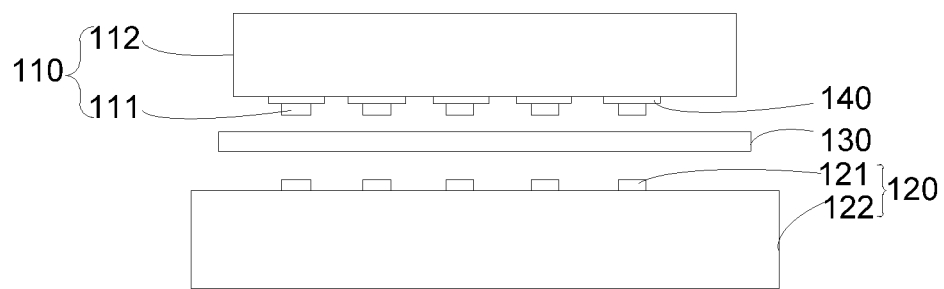
FIGS. 1A and 1B are structural diagrams of a circuit component according to an embodiment of the present disclosure.
Figure 1B:
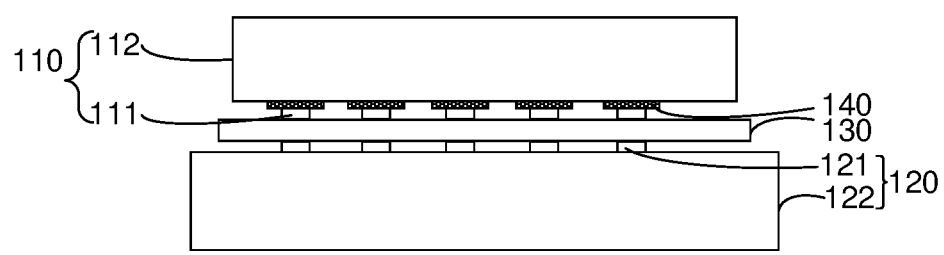

As shown in FIG. 1A and FIG. 1B, illustrated is a circuit component 100. The circuit component 100 comprises a first circuit board 110, a second circuit board 120 and a conductive adhesive layer 130. The first circuit board 110 may further comprise a first conductive loop 111, and the second circuit board 120 may further comprise a second conductive loop 121 corresponding to the first conductive loop 111 on the first circuit board 110. The first circuit board 110 is bonded to the second circuit board 120 through the conductive adhesive layer 130 described above, so that the first conductive loop 111 may be electrically connected to the second conductive loop 121. At least one of the first circuit board 110 and the second circuit board 120 comprises a bonding detection layer 140 which is capable of detecting a bonding parameter between the first circuit board 110 and the second circuit board 120 and is also capable of emitting a detection signal when the bonding parameter reaches a preset value.

In the circuit component 100 having the structure according to the present embodiment, in the process of bonding the first circuit board 110 to the second circuit board 120 so that the first conductive loop 111 on the first circuit board 110 is electrically connected to the second conductive loop 121 on the second circuit board 120, a bonding parameter between the first circuit board 110 and the second circuit board 120 may be detected by a provided bonding detection layer 140, and a current bonding state of the circuit component 100 may be determined according to a detection signal emitted by the bonding detection layer 140, which can realize a good press-fit process of the circuit component 100, thereby effectively improving the bonding yield of the circuit component 100. In addition, after the bonding is completed, there is no need to detect the circuit component 100 again, which can simplify the process of manufacturing the circuit component 100 and reduce the manufacturing cost.

As a specific application of the circuit component 100 described above, for example, the circuit component 100 may be applied to a display apparatus in which one circuit board (for example, the second circuit board 120) is provided on a display substrate, and the other circuit board (for example, the first circuit board 110) provides a driving signal to the display substrate. The circuit component 100 is excellent in bonding process, which can ensure the stability of signal transmission of the display apparatus and improve the usability of the display apparatus.

It is to be noted that the conductive adhesive layer 130 is not specifically defined, for example, it may be a conductive adhesive material such as Anisotropic Conductive Adhesives (ACAs) or Isotropic Conductive Adhesives (ICAs).

It is to be understood that when the first circuit board 110 is bonded to the second circuit board 120 so that the first conductive loop 111 is electrically connected to the second conductive loop 121, one of the first conductive loop 111 or the second conductive loop 121 should be used as a positioning reference and the other is positioned correspondingly to the positioning reference to ensure the stability of the electrical connection between the two conductive loops.

It is further to be noted that the preset value may be an optimum bonding parameter obtained through theoretical calculation or experimentally, and when the bonding detection layer 140 emits a detection signal, it indicates that the bonding parameter between the first circuit board 110 and the second circuit board 120 reaches the optimum bonding parameter, in which case a good press-fit process between the first circuit board 110 and the second circuit board 120 is realized, thereby effectively ensuring the bonding yield.

It is further to be noted that the preset value may be, for example, a preset pressure value, a preset deformation quantity etc., and a type of the preset value may be selected according to practical detection requirements.

In some embodiments, the bonding detection layer 140 comprises a pressure detection layer and/or a deformation quantity detection layer, and correspondingly, the bonding parameter comprises a bonding pressure value and/or a deformation quantity of the bonding detection layer.

In the circuit component 100 having the structure according to the present embodiment, a specific structure of the bonding detection layer 140 is illustrated; however, the present disclosure is not limited thereto. When the bonding detection layer 140 comprises a pressure detection layer, the pressure detection layer may be used to detect a bonding pressure value applied between the first circuit board 110 and the second circuit board 120. When the bonding pressure value reaches a preset pressure value, the bonding detection layer 140 may emit a detection signal. Thereby, a simple structure of the bonding detection layer is realized. When the bonding detection layer 140 comprises a deformation quantity detection layer, the deformation quantity detection layer may be used to detect a deformation quantity thereof or a deformation quantity of the first circuit board 110 or the second circuit board 120, determine a bonding pressure value applied between the first circuit board 110 and the second circuit board 120 according to the deformation quantity and then determine the bonding process based thereon, which can effectively ensure the bonding yield between the first circuit board 110 and the second circuit board 120.

In some embodiments, as a first implementation of the bonding detection layer 140 described above, the bonding detection layer 140 may be provided on the first circuit board 110. Specifically, the first circuit board 110 may further comprise a first base substrate 112, wherein the bonding detection layer 140 may be located between the first conductive loop 111 and the first base substrate 112.

In the circuit component 100 having the structure according to the present embodiment, the bonding detection layer 140 is located between the first conductive loop 111 and the first base substrate 112, which can more accurately detect the bonding parameter applied between the first conductive loop 111 and the second conductive loop 121, and can emit a detection signal as a feedback in time according to the bonding parameter, thereby further improving the bonding yield.

In some embodiments, as a second implementation of the bonding detection layer 140 described above, the bonding detection layer 140 may be provided on the second circuit board 120. Specifically, the second circuit board 120 may further comprise a second base substrate 122, wherein the bonding detection layer 140 is located between the second base substrate 122 and the second conductive loop 121.

In the circuit component 100 having the structure according to the present embodiment, the bonding detection layer 140 is located between the second conductive loop 121 and the second base substrate 122, which can more accurately detect the bonding parameter applied between the first conductive loop 111 and the second conductive loop 121, and can emit a detection signal as a feedback in time according to the bonding parameter, thereby further improving the bonding yield.

In some embodiments, as a specific structure of the pressure detection layer described above, for example, the pressure detection layer 140 may comprise a mechanochromism or piezochromism material layer, in which case, the bonding parameter is correspondingly a bonding pressure value. A first color is displayed when the bonding pressure value received by the mechanochromism material layer does not reach a preset pressure value (for example, as shown in FIG. 1A), and a second color is displayed when the bonding pressure value received by the mechanochromism material layer reaches the preset pressure value (for example, as shown in FIG. 1B), wherein the detection signal comprises a color signal of the second color.

In the circuit component 100 having the structure according to the present embodiment, the pressure detection layer comprises a mechanochromism material layer. With the characteristics of the mechanochromism material, when the bonding pressure value received by the mechanochromism material does not reach the preset pressure value, a first color is displayed, and when the bonding pressure value received by the mechanochromism material reaches the preset pressure value, the current display color is changed and a second color is displayed. The color change of the mechanochromism material can facilitate an operator to judge the current bonding process, and when the operator observes the color change, it indicates that the bonding pressure value has reached the preset pressure value. In this way, a good press-fit process can be ensured, thereby effectively guaranteeing the bonding yield, and realizing a simple structure and convenient operation.

It should be noted that a specific structure of the mechanochromism material layer is not limited, for example, an internal molecular structure thereof may comprise a force chromophore, which is a class of special small molecules that can produce a specific chemical reaction and change physiochemical property of the material under the action of an external force. Such material may be polyester containing spirothiopyran, and of course, may also be mechanochromism or piezochromism materials with other structures.

In some embodiments, as another specific structure of the pressure detection layer described above, for example, the pressure detection layer may further comprise a fluorescent film. When the bonding pressure value received by the fluorescent film does not reach the preset pressure value, the fluorescent film may emit fluorescence at a first intensity, and when the bonding pressure value received by the fluorescent film reaches the preset pressure value, the fluorescent film may emit fluorescence at a second intensity, wherein the detection signal comprises a fluorescent signal at the second intensity emitted by the fluorescent film.

It is to be understood that, according to the characteristics of the fluorescent film, when different bonding pressure values are received by the fluorescent film, the fluorescent film may emit fluorescence at different intensities. Therefore, intensity of the fluorescence at the first intensity is not a fixed value. The intensity of the fluorescence emitted by the fluorescent film may be in a positive correlation relation or negative correlation relation with the bonding pressure value received by the fluorescent film, which is specifically depends on the characteristics of the fluorescent film used.

In the circuit component 100 having the structure according to the present embodiment, with the characteristics of the fluorescent film, when different bonding pressure values are received by the fluorescent film, the fluorescent film may emit fluorescence at different intensities, and when the fluorescent film emits fluorescence at the second intensity, it indicates that the current bonding pressure value reaches a preset bonding pressure value, in which case, a good press-fit process between the first circuit board 110 and the second circuit board 120 can be realized, thereby effectively ensuring the bonding yield of the circuit component 100 and thus ensuring stable signal transmission between both of the circuit boards.

It is to be noted that there is no limitation on how to detect the intensity of the fluorescence emitted by the fluorescent film, for example, when the circuit component 100 is bonded using the bonding device, a fluorescence intensity detector may be provided on the bonding device to detect the intensity of the fluorescence etc.

It is further to be noted that when the bonding detection layer 140 comprises a deformation quantity detection layer, a specific structure of the deformation quantity detection layer is not limited, for example, it may be a displacement sensor provided on the first circuit board 110 or the second circuit board 120. The displacement sensor is used to detect deformation of the first circuit board 110 or the second circuit board 120 or deformation of the conductive adhesive layer 130 or deformation of the displacement sensor per se under a bonding pressure, and thereby determine a bonding press-fit condition between the first circuit board 110 and the second circuit board 120. Of course, the deformation quantity detection layer may also be other structures capable of measuring deformation of an object.

In some embodiments, in order to improve the stability of signal transmission, the first circuit board 110 comprises a plurality of first conductive loops 111, and the second circuit board 120 comprises a plurality of second conductive loops 121. At least one of the first circuit board 110 and the second circuit board 120 comprises a plurality of bonding detection layers 140, each of which is provided correspondingly to a conductive loop on a corresponding circuit board. The plurality of bonding detection layers 140 may detect bonding parameters applied to conductive loops corresponding thereto, thereby further improving the bonding yield.

Specifically, for example, the plurality of bonding detection layers 140 are provided on the first circuit board 110, and each of the bonding detection layers 140 may correspond to one of the first conductive loops 111 or may also correspond to a plurality of first conductive loops 111. Further, when the bonding detection layers 140 are pressure detection layers, a separate bonding pressure may be applied to each of the first conductive loops 111 on the first circuit board 110 in the circuit component 100, so that a detection signal fed back by a pressure detection layer at the first conductive loop 111 judges a press-fit condition at the first conductive loop 111, thereby effectively ensuring the press-fit process at the first conductive loop 111. In this way, the first conductive loop 111 can be electrically connected to a second conductive loop 121 corresponding thereto, thereby effectively ensuring the stability of signal transmission, and improving the product yield.

In some embodiments, the first circuit board 110 comprises any of an IC, a FPC, and a COF.

In some embodiments, the second circuit board 120 comprises a display substrate.

Specifically, the present embodiment will be described by taking the first circuit board 110 comprising an integrated circuit as an example. According to a function of the designed integrated circuit, a number of electronic elements such as transistors, resistors, capacitors and inductors etc. are interconnected through wiring and are made on one or several small pieces of semiconductor wafers or dielectric substrates, and are then packaged in a pipe shell, to form a micro-structure having desired circuit functions. The integrated circuit often comprises a number of electrodes (corresponding to the first conductive loops 111). In an apparatus using the integrated circuit, for example, a display substrate (corresponding to the second circuit board 120), the display substrate and the integrated circuit are bonded using a conductive adhesive, so that a number of electrodes in the integrated circuit are electrically connected to electrodes on the display substrate so as to provide a driving signal to the display substrate. In order to ensure the stability of the electrical connection between the electrodes of the integrated circuit and the electrodes of the display substrate to ensure the stability of the signal transmission, a bonding parameter between the integrated circuit and the display substrate is detected by using the bonding detection layer 140 provided on the integrated circuit or the display substrate, and a press-fit process between both of the integrated circuit and the display substrate is completed according to a detection signal fed back by the bonding detection layer 140, which can effectively ensure the bonding yield and improve the performance of the display substrate.

It should be noted that a specific structure of the first circuit board 110 and the second circuit board 120 in the circuit component 100 is not limited to the above several structures. A structure of a circuit board which requires to be bonded to achieve electrical connection between two circuit elements should be included within the protection scope of the present disclosure.

Figure 3:
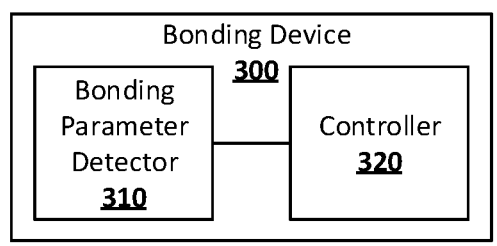
FIG. 3 is a block diagram of a bonding device for bonding a circuit component according to an embodiment of the present disclosure.

In some embodiments of the present disclosure, for example, as shown in FIG. 3, a bonding device 300 is proposed. The bonding device 300 is used to bond circuit components 100 including the circuit component 100 described in any of the embodiments described above. The bonding device 300 further comprises a bonding parameter detector 310 and a controller 320, wherein the bonding parameter detector 310 is located outside of the circuit component 100 and configured to detect a bonding parameter, and the controller 320 is configured to receive a detection signal, and control the bonding device 300 to stop applying the bonding when the detection signal is received.

In the bonding device 300 having the structure according to the present embodiment, a specific structure is not limited, for example, it may further comprise an indenter and a driving mechanism. The indenter may be provided at one end of the driving mechanism. The bonding parameter detector 310 may be located at one end of the indenter which is configured to apply a pressure, to detect a bonding parameter which is applied by the indenter to the first circuit board 110 or the second circuit board 120. The driving mechanism is electrically connected to the controller 320, and the controller 320 controls a movement direction and a movement speed etc. of the driving mechanism. The controller 320 is also electrically connected to the bonding detection layer 140 to receive a detection signal fed back by the bonding detection layer 140. The driving mechanism drives the indenter to move to be in contact with the circuit component 100 and apply a bonding pressure to the first circuit board 110 and the second circuit board 120 under the control of the controller 320, and when the bonding detection layer 140 emits a detection signal, it indicates that the current bonding process needs to be completed and the controller 320 controls the driving mechanism to move away from the circuit component 100 so that the indenter is separated from the circuit component to complete the bonding process of the circuit component. The bonding device 300 with the structure has advantages such as simple structure and real-time monitoring of the bonding parameter applied to the circuit component 100, which can effectively ensure the bonding yield and improve the performance of the product.

Of course, the structure of the bonding device 300 may also comprise only the indenter, and a pressure is applied to the circuit component 100 by an operator holding the indenter. At this time, in some embodiments, the bonding detection layer 140 is implemented with the mechanochromism material layer described above, and when a color of the mechanochromism material layer changes, it indicates that the applied bonding pressure value has reached the preset pressure value, and at this time, the bonding pressure may be released to complete the bonding process of the circuit component 100, which realizes a simpler structure.

In some embodiments, when the bonding detection layer 140 in the circuit component 100 comprises a fluorescent film, the bonding parameter detector 310 in the bonding device 300 may be a fluorescence intensity detector.

Figure 2:
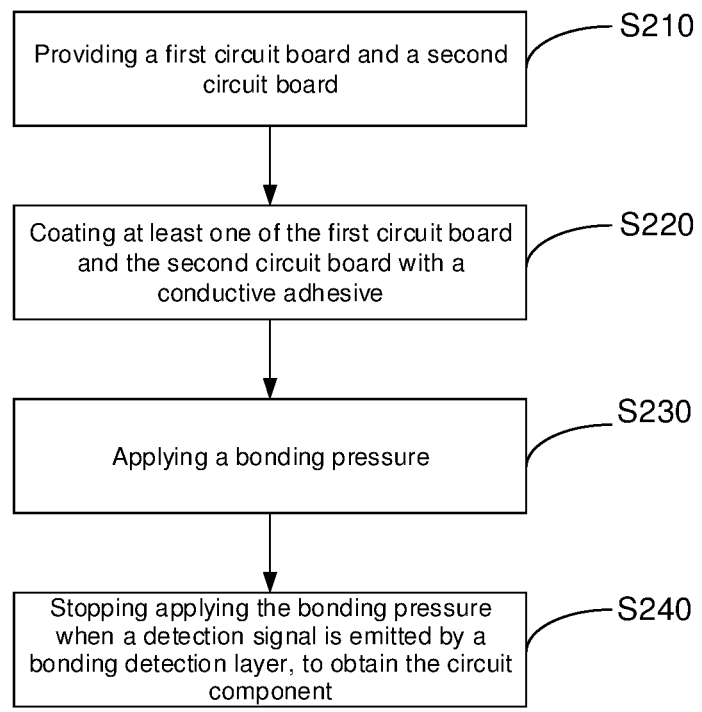
FIG. 2 is a flowchart of a method for manufacturing a circuit component according to an embodiment of the present disclosure.

In some embodiments of the present disclosure, a method 200 for manufacturing a circuit component is proposed, as shown in FIG. 2. The method 200 comprises the following steps.

In S210, a first circuit board and a second circuit board are provided.

It is to be noted that, in this step, at least one of the provided first circuit board and second circuit board has formed with a bonding detection layer. Specifically, by taking a bonding detection layer being a pressure detection layer as an example, a pressure detection layer is deposited on the first circuit board, and a first conductive loop is deposited on the pressure detection layer. A second conductive loop is formed on the second circuit board, or a pressure detection layer is deposited on the second circuit board and then a second conductive loop is deposited on the pressure detection layer etc.

In S220, at least one of the first circuit board and the second circuit board is coated with a conductive adhesive.

The purpose of coating with the conductive adhesive is to enable the first conductive loop on the first circuit board and the second conductive loop on the second circuit board to be electrically connected, and specifically the conductive adhesive may use materials such as Anisotropic Conductive Adhesives (ACAs) or Isotropic Conductive adhesives (ICAs) etc.

In addition, in some embodiments, step S220 is an optional step. For example, when at least one of the first circuit board and the second circuit board comprises a conductive adhesive for bonding (for example, a first and/or second circuit board comprising a conductive adhesive which is purchased from a third party), the step S220 may be omitted.

In S230, a bonding pressure is applied.

In this step, the bonding device 300 according to the embodiments of the present disclosure described above may be used to apply a bonding pressure to the circuit component in step S220. Of course, a bonding device with other structures may also be used.

In S240, when the bonding detection layer emits a detection signal, application of the bonding pressure is stopped to obtain the circuit component.

It should be noted that still by taking the bonding detection layer comprising the pressure detection layer as an example, in this step, when the bonding pressure value reaches the preset pressure value, the pressure detection layer may emit the detection signal. If the bonding device 300 according to the embodiments of the present disclosure described above is used, when the controller 320 receives the detection signal, the controller 320 may control the bonding device 300 to stop applying the bonding pressure to complete the bonding process of the circuit component. It is also possible for an operator to use a conventional bonding device 300 to stop applying the bonding pressure using the characteristics of the pressure detection material, for example, in a case of the mechanochromism material, according to the color change of the mechanochromism material.

In the method for manufacturing a circuit component according to the present embodiment, it is possible to effectively ensure the bonding press-fit yield between the first circuit board and the second circuit board in the circuit component by using the detection signal fed back by the bonding detection layer, which can effectively ensure the electrical connection between the first conductive loop on the first circuit board and the second conductive loop on the second circuit board, thereby ensuring the stability of signal transmission between both of the circuit boards.

In some embodiments, before applying the bonding pressure, the method 200 may further comprise:

a step of aligning the first conductive loop and the second conductive loop.

Specifically, the second conductive loop may be aligned with the first conductive loop with the first conductive loop as a positioning reference, or the first conductive loop may be aligned with the second conductive loop with the second conductive loop as a positioning reference etc. This can effectively ensure the bonding yield and the stability of signal transmission between the circuit components after the completion of the bonding.

With respect to the circuit component according to some embodiments of the present disclosure, in the process of bonding the first circuit board and the second circuit board, a bonding parameter between the first circuit board and the second circuit board may be detected by the provided bonding detection layer, and a current bonding state of the circuit component is determined according to a detection signal emitted by the bonding detection layer, which can realize a good press-fit process of the circuit component, effectively improve the bonding yield of the circuit component, simply the process of manufacturing the circuit component, and reduce the manufacturing cost.

With respect to the bonding device 300 according to some embodiments of the present disclosure, the controller 320 is electrically connected to the bonding detection layer to receive a detection signal fed back by the bonding detection layer and may control the bonding device 300 to stop bonding according to the signal. The bonding device 300 has a simple structure, and can monitor the bonding parameter which is applied to the circuit component in real time, thereby effectively ensuring the bonding yield and improving the performance of the product.

With respect to the manufacturing method according to some embodiments of the present disclosure, it is possible to effectively ensure the bonding press-fit yield between the first circuit board and the second circuit board in the circuit component by using the detection signal fed back by the bonding detection layer, thereby ensuring the stability of signal transmission between both of the circuit boards.

It is to be understood that the above embodiments are merely illustrative embodiments for the purpose of illustrating the principles of the present disclosure; however, the present disclosure is not limited thereto. It will be apparent to those of ordinary skill in the art that various variations and improvements can be made therein without departing from the spirit and essence of the present disclosure, and the variations and improvements are also to be regarded to be within the protection scope of the present disclosure.

We claim:

1. A circuit component, comprising:
    a first circuit board; and
    a second circuit board,
    wherein at least one of the first circuit board and the second circuit board comprises a bonding detection layer operable to:
        detect a bonding parameter between the first circuit board and the second circuit board; and
        emit a detection signal when the bonding parameter reaches a preset value, and
    wherein the bonding detection layer comprises at least one of the group consisting of:
        a pressure detection layer, wherein the bonding parameter is a bonding pressure value; and a deformation quantity detection layer, wherein the bonding parameter is a deformation quantity of the bonding detection layer.

2. The circuit component according to claim 1, further comprising:
a conductive adhesive layer provided between the first circuit board and the second circuit board, and operable to electrically connect corresponding conductive loops on the first circuit board and the second circuit board.

3. The circuit component according to claim 1, wherein the bonding detection layer comprises a pressure detection layer, and the pressure detection layer comprises a mechanochromism material layer, wherein:
when a bonding pressure value received by the mechanochromism material layer does not reach a preset pressure value, a first color is displayed; and
when the bonding pressure value received by the mechanochromism material layer reaches the preset pressure value, a second color is displayed, wherein the detection signal comprises a color signal of the second color.

4. The circuit component according to claim 1, wherein the bonding detection layer comprises a pressure detection layer, and the pressure detection layer comprises a fluorescent film, wherein:
when a bonding pressure value received by the fluorescent film does not reach a preset pressure value, the fluorescent film emits fluorescence at a first intensity; and
when the bonding pressure value received by the fluorescent film reaches the preset pressure value, the fluorescent film emits fluorescence at a second intensity, wherein the detection signal comprises a fluorescence signal at the second intensity emitted by the fluorescent film.

5. A bonding device for bonding circuit components including the circuit component according to claim 1, the bonding device comprising:
a bonding parameter detector located outside of the circuit component and operable to detect the bonding parameter; and
a controller operable to receive the detection signal and control the bonding device to stop applying bonding when the detection signal has been received.

6. The circuit component according to claim 2, wherein the first circuit board comprises a first base substrate and the bonding detection layer is provided on the first base substrate.

7. The circuit component according to claim 2, wherein the first circuit board comprises any of an integrated circuit, a flexible printed circuit, and a chip on flex.

8. The circuit component according to claim 2, wherein the second circuit board comprises a display substrate.

9. The circuit component according to claim 2, wherein:
the first circuit board comprises a plurality of first conductive loops, and the second circuit board comprises a plurality of second conductive loops, each of the first conductive loops corresponding to one of the second conductive loops; and
at least one of the first circuit board and the second circuit board comprises a plurality of bonding detection layers, each of the bonding detection layers being provided correspondingly to a conductive loop on a corresponding circuit board.

10. The bonding device according to claim 5, wherein the bonding parameter detector comprises a fluorescence intensity detector.

11. A method for manufacturing a circuit component, the method comprising:
providing a first circuit board and a second circuit board;
applying a bonding pressure; and
stopping applying the bonding pressure when a detection signal is emitted by a bonding detection layer, to obtain the circuit component,
wherein the bonding detection layer is provided on the first circuit board and/or the second circuit board, and the bonding detection layer is operable to emit the detection signal when the bonding parameter reaches a preset value,
wherein the bonding detection layer comprises a pressure detection layer, and the bonding parameter is a bonding pressure value; and/or
wherein the bonding detection layer comprises a deformation quantity detection layer, and the bonding parameter is a deformation quantity of the bonding detection layer.

12. The method according to claim 11, wherein before applying the bonding pressure, the method further comprises:
coating at least one of the first circuit board and the second circuit board with a conductive adhesive.

* * * * *